(12) United States Patent
Seifert et al.

(10) Patent No.: US 9,660,136 B2
(45) Date of Patent: *May 23, 2017

(54) NITRIDE NANOWIRES AND METHOD OF PRODUCING SUCH

(71) Applicant: QUNANO AB, Lund (SE)

(72) Inventors: Werner Seifert, Sebnitz (DE); Damir Asoli, Malmo (SE); Zhaoxia Bi, Lund (SE); Jonas Ohlsson, Malmo (SE); Lars Ivar Samuelson, Malmo (SE)

(73) Assignee: QUNANO AB, Lund (SE)

( * ) Notice: Subject to any disclaimer, the term of this patent is extended or adjusted under 35 U.S.C. 154(b) by 0 days.

This patent is subject to a terminal disclaimer.

(21) Appl. No.: 14/685,849

(22) Filed: Apr. 14, 2015

(65) Prior Publication Data

US 2015/0221817 A1 Aug. 6, 2015

Related U.S. Application Data

(63) Continuation of application No. 14/074,021, filed on Nov. 7, 2013, now Pat. No. 9,024,338, which is a
(Continued)

(30) Foreign Application Priority Data

Jan. 12, 2007 (SE) ...................... 0700102

(51) Int. Cl.
*H01L 33/00* (2010.01)
*B82Y 10/00* (2011.01)
(Continued)

(52) U.S. Cl.
CPC .......... *H01L 33/0075* (2013.01); *B82Y 10/00* (2013.01); *C30B 25/00* (2013.01);
(Continued)

(58) Field of Classification Search
None
See application file for complete search history.

(56) References Cited

U.S. PATENT DOCUMENTS 6,130,142 A 10/2000 Westwater et al.
6,596,377 B1 7/2003 Hersee et al.
(Continued)

FOREIGN PATENT DOCUMENTS

JP 2006332650 12/2006
JP 2007027298 2/2007
(Continued)

OTHER PUBLICATIONS

Canadian Office Action and Search Report for Canadian Application No. 2,674,448, dated Apr. 9, 2015, (3 pages).
(Continued)

*Primary Examiner* — Andres Munoz
(74) *Attorney, Agent, or Firm* — The Marbury Law Group PLLC

(57) ABSTRACT

The present invention relates to the growing of nitride semiconductors, applicable for a multitude of semiconductor devices such as diodes, LEDs and transistors. According to the method of the invention nitride semiconductor nanowires are grown utilizing a CVD based selective area growth technique. A nitrogen source and a metal-organic source are present during the nanowire growth step and at least the nitrogen source flow rate is continuous during the nanowire growth step. The V/III-ratio utilized in the inventive method is significantly lower than the V/III-ratios commonly associated with the growth of nitride based semiconductor.

5 Claims, 10 Drawing Sheets

Related U.S. Application Data continuation of application No. 13/654,892, filed on Oct. 18, 2012, now Pat. No. 8,664,094, which is a continuation of application No. 12/941,486, filed on Nov. 8, 2010, now Pat. No. 8,309,439, which is a continuation of application No. 12/308,249, filed as application No. PCT/SE2008/050036 on Jan. 14, 2008, now Pat. No. 7,829,443.

(51) Int. Cl.
```
C30B 25/00      (2006.01)
C30B 29/40      (2006.01)
C30B 29/60      (2006.01)
H01L 21/02      (2006.01)
H01L 29/06      (2006.01)
H01L 29/20      (2006.01)
H01L 33/06      (2010.01)
H01L 21/20      (2006.01)
H01L 33/24      (2010.01)
H01L 33/32      (2010.01)
H01L 33/18      (2010.01)
B82Y 40/00      (2011.01)
```

(52) U.S. Cl.
CPC ............ *C30B 29/406* (2013.01); *C30B 29/60* (2013.01); *H01L 21/0254* (2013.01); *H01L 21/0262* (2013.01); *H01L 21/02458* (2013.01); *H01L 21/02603* (2013.01); *H01L 21/02636* (2013.01); *H01L 21/02639* (2013.01); *H01L 21/20* (2013.01); *H01L 29/0665* (2013.01); *H01L 29/0673* (2013.01); *H01L 29/0676* (2013.01); *H01L 29/2003* (2013.01); *H01L 33/06* (2013.01); *H01L 33/24* (2013.01); *H01L 33/32* (2013.01); *B82Y 40/00* (2013.01); *H01L 33/007* (2013.01); *H01L 33/18* (2013.01); *Y10S 977/932* (2013.01)

(56) References Cited

U.S. PATENT DOCUMENTS

| | | | |
|---|---|---|---|
| 6,692,568 | B2 | 2/2004 | Cuomo et al. |
| 6,693,021 | B1 | 2/2004 | Motoki et al. |
| 6,709,929 | B2 | 3/2004 | Zhang et al. |
| 7,303,631 | B2 | 12/2007 | Conley, Jr. et al. |
| 7,309,621 | B2 | 12/2007 | Conley, Jr. et al. |
| 7,335,908 | B2 | 2/2008 | Samuelson et al. |
| 7,354,850 | B2 | 4/2008 | Seifert et al. |
| 7,445,742 | B2 | 11/2008 | Chen et al. |
| 7,821,022 | B2 | 10/2010 | Kim |
| 7,829,443 | B2 | 11/2010 | Seifert et al. |
| 8,309,439 | B2 | 11/2012 | Seifert et al. |
| 8,664,094 | B2 | 3/2014 | Seifert et al. |
| 8,691,011 | B2 | 4/2014 | Samuelson et al. |
| 2003/0089899 | A1 | 5/2003 | Lieber et al. |
| 2003/0168964 | A1 | 9/2003 | Chen |
| 2004/0262636 | A1 | 12/2004 | Yang et al. |
| 2005/0011431 | A1 | 1/2005 | Samuelson et al. |
| 2005/0082543 | A1 | 4/2005 | Alizadeh et al. |
| 2005/0161662 | A1 | 7/2005 | Majumdar et al. |
| 2006/0008942 | A1 | 1/2006 | Romano et al. |
| 2006/0060833 | A1 | 3/2006 | Bruckner et al. |
| 2006/0073680 | A1 | 4/2006 | Han et al. |
| 2006/0112466 | A1 | 5/2006 | Den |
| 2006/0125056 | A1 | 6/2006 | Samuelson et al. |
| 2006/0223211 | A1 | 10/2006 | Mishra et al. |
| 2006/0292055 | A1 | 12/2006 | Byeun et al. |
| 2007/0001220 | A1 | 1/2007 | Tombler, Jr. et al. |
| 2007/0041214 | A1 | 2/2007 | Ha et al. |
| 2007/0152353 | A1 | 7/2007 | Park |
| 2007/0172183 | A1 | 7/2007 | Wang |
| 2007/0190677 | A1 | 8/2007 | Okuyama et al. |
| 2007/0257264 | A1 | 11/2007 | Hersee et al. |
| 2007/0286945 | A1 | 12/2007 | Lahnor et al. |
| 2008/0036038 | A1 | 2/2008 | Hersee et al. |
| 2008/0149946 | A1 | 6/2008 | Kim et al. |
| 2009/0169828 | A1 | 7/2009 | Hersee et al. |
| 2009/0301389 | A1 | 12/2009 | Samuelson et al. |
| 2014/0061586 | A1 | 3/2014 | Seifert et al. |

FOREIGN PATENT DOCUMENTS

| | | |
|---|---|---|
| JP | 200834483 A | 2/2008 |
| JP | 2008547235 A | 12/2008 |
| WO | WO2006025793 A1 | 3/2006 |
| WO | WO2006130359 A3 | 12/2006 |
| WO | WO2008079078 A1 | 7/2008 |

OTHER PUBLICATIONS

European Office Communication Rules 70(2) and 70a(2) for European Application No. 08705308.8 dated Mar. 20, 2015 (1 page).
European Office Communication and Supplemental Search Report for European Application No. 08705308.8 dated Mar. 3, 2015 (6 pages).
Korean Office Communication for KR 10-2015-7010408, dated May 29, 2015 (4 pages).
International Search Report and Written Opinion dated Apr. 25, 2008, in counterpart PCT/SE2008/050036, 12 pages.
Akasaka et al., "GaN Hexagonal Microprisms with Smooth Vertical Facets Fabricated by Selective Metalorganic Vapor Phase Epitaxy," Appl. Phys. Lett. 71 (15), Oct. 1997.
Beaumont et al., "Magnesium Induced Changes in the Selective Growth of GaN by Metalorganic Vapor Phase Epitaxy," Applied Physics Letters, vol. 72, No. 8, Feb. 1998.
Bertness et al., "Catalyst-Free Growth of GaN Nanowires," Journal of Electronic Materials, 2006, 35(4):576-580.
Dailey et al., "Vapor-liquid-solid growth of germanium nanostructures on silicon," Journal of Applied Physics, Dec. 15, 2004, 96(12):7556-7567.
Hersee et al., "The Controlled Growth of GaN Nanowires," Nano Letters, 2006, 6(8):1808-1811.
Hiramatsu et al., "Recent Progress in Selective Area Growth and Epitaxial Lateral Overgrowth of III-Nitrides: Effects of Reactor Pressure in MOVPE Growth," Phys. Stat. Sol. (a) 176, 535, (1999).
Kipshidze et al., "Controlled growth of GaN nanowires by pulsed metalorganic chemical vapor deposition," Applied Physics Letters, 2005, 86:033104-1 to 033104-3.
Liang et al., "Selective-Area Growth of Indium Nitride Nanowires on Gold-Patterned Si(100) Substrates," Applied Physics Letters, Jul. 1, 2002, 81 (1): 22-24.
Ma et al., "Small-Diameter Silicon Nanowire Surfaces," Science, Mar. 21, 2003, 299:1874-1877.
Mohan et al., "Controlled growth of highly uniform, axial/radial direction-defined, individually addressable InP nanowire arrays," Nanotechnology, 2005, 16:2903-2907.
Mohan et al., "Realization of conductive InAs nanotubes based on lattice-mismatched InP/InAs core-shell nanowires," Applied Physics Letters, 2006, 88:013110-1 to 013110-3.
Pan et al., "Single-crystal growth of metallic nanowires with preferred orientation," Nanotechnology, 2005, 16:1559-1564.
Qian et al., "Core/Multishell Nanowire Heterostructures as Multicolor, High-Efficiency Light-Emitting Diodes," Nano Letters, 2005, 5(11):2287-2291.
Sears, G.W., "A Mechanism of Whisker Growth," Acta Metallurgica, vol. 3, Jul. 1955.
Su et al., "Catalytic Growth of Group III-Nitride Nanowires and Nanostructures by Metalorganic Chemical Vapor Deposition," Applied Physics Letters, 2005, 86: 013105-1 through 013105-3.
Xia et al., "One-Dimensional Nanostructures: Synthesis, Characterization, and Applications," Adv. Mater., Mar. 2003, 15, No. 5.
First Office Action, Dec. 21, 2010, Chinese Patent Application No. 200880002009.9, State Intellectual Property Office, P.R. China.
European Patent Office, Office Communication, EP Application No. 08705308.8, issued Mar. 3, 2015, 4pgs.

(56) References Cited

OTHER PUBLICATIONS

Supplemental European Search Report, EP Application No. 08705308.8, issued Feb. 23, 2015, 2pgs.
Japanese Patent Office, Japan Application No. 2013-168662, Office Action issued May 26, 2014.
Japanese Patent Office, Japan Application No. 2013-168662, Office Action issued Oct. 20, 2014.
Korean Patent Office, Korea Application No. 2009-7016715, issued Mar. 27, 2014.
Korean Office Action, Notice of Final Rejection for Korean Patent Application No. 2015-7010408, dated Jan. 27, 2016 (3 pages).
European Office Action, Communication pursuant to Article 94(3) EPC, for European Patent Application No. 08705308.8, dated Oct. 4, 2016 (6 pages).

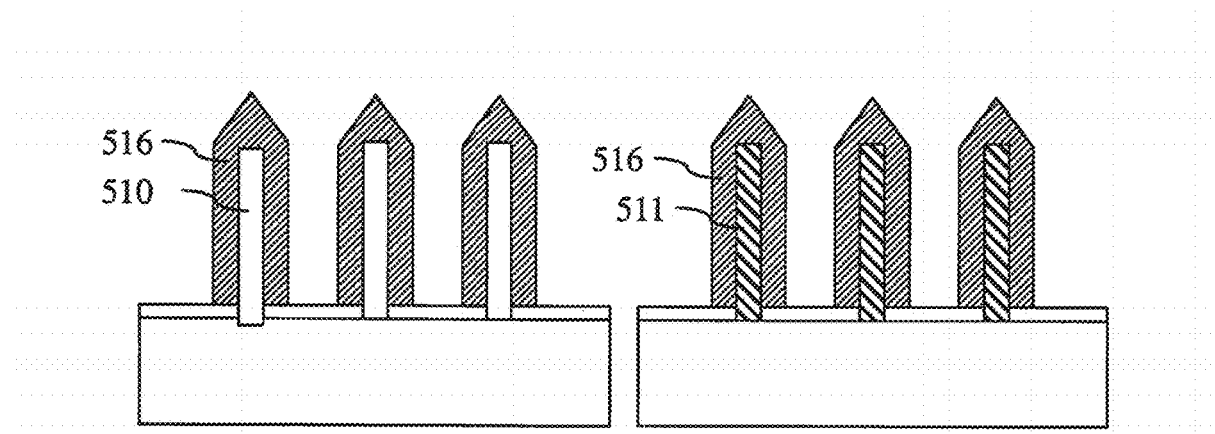
*Fig. 5a*  *Fig. 5b*
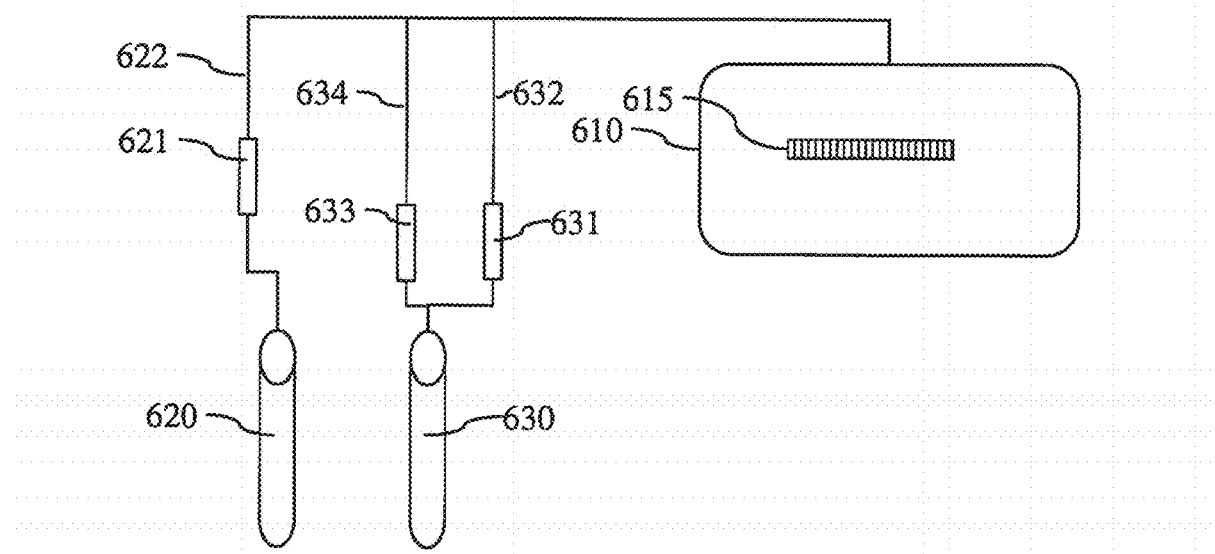
*Fig. 6*

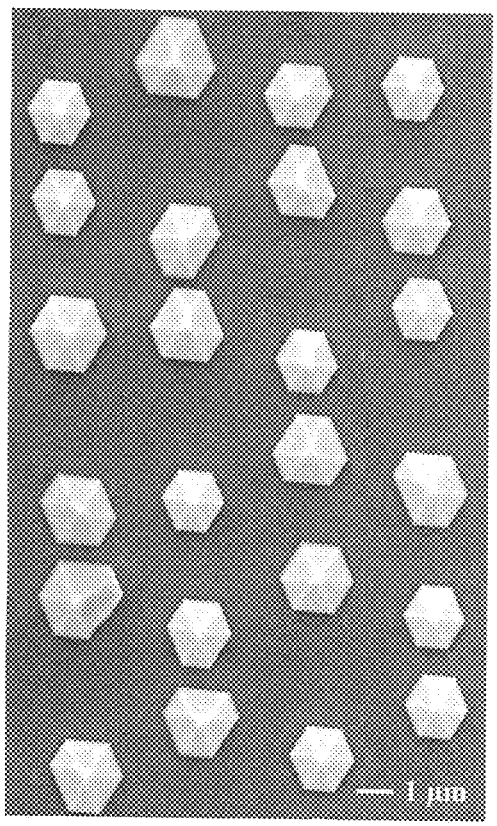 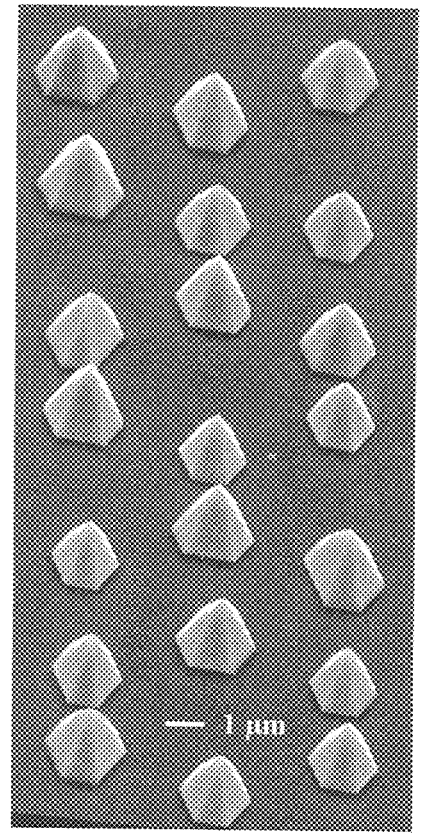
*Fig. 7a*　　　*Fig. 7b*

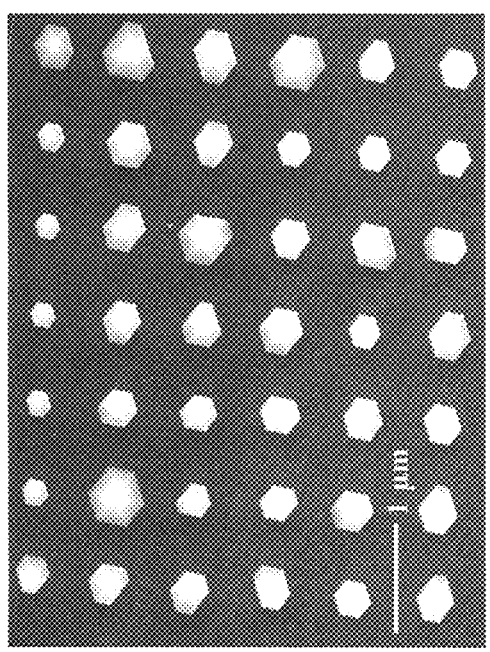 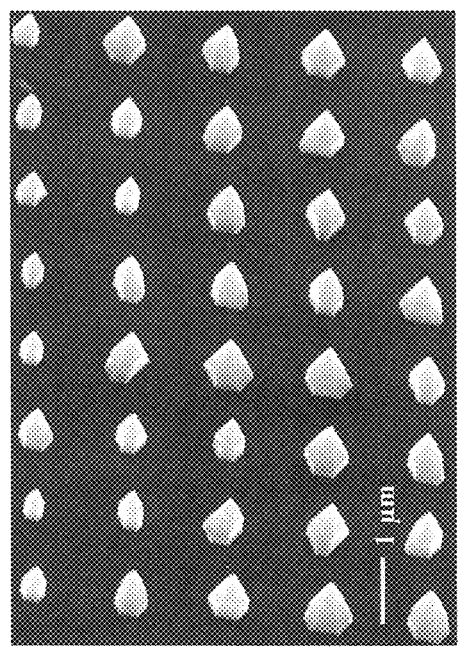
*Fig. 9a*  *Fig. 9b*

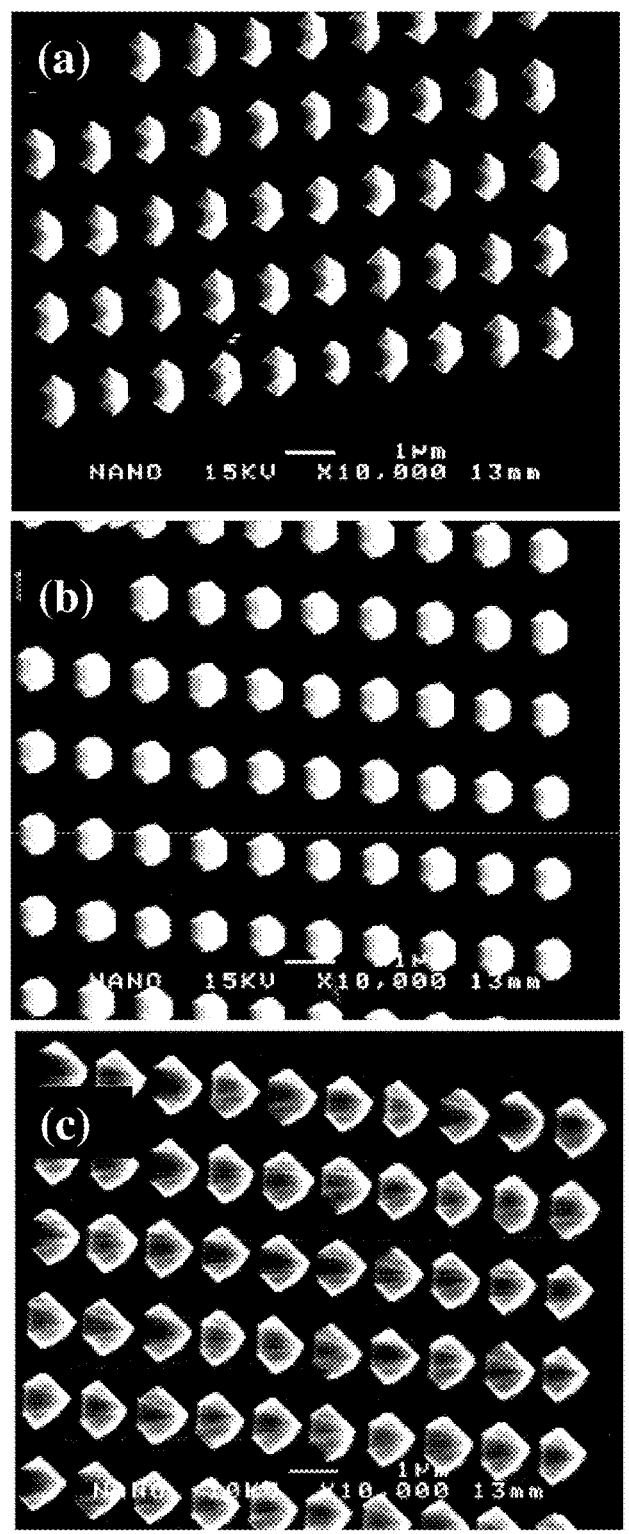
*Fig. 11a-c*

NITRIDE NANOWIRES AND METHOD OF PRODUCING SUCH

RELATED APPLICATIONS

This application is a Continuation application of co-pending U.S. application Ser. No. 13/654,892, filed Oct. 18, 2012, which is a continuation of U.S. application Ser. No. 12/941,486, filed Nov. 8, 2010, now U.S. Pat. No. 8,309,439, issued Nov. 13, 2012, which is a continuation of U.S. application Ser. No. 12/308,249, filed Dec. 11, 2008, now U.S. Pat. No. 7,829,443, issued Nov. 9, 2010. U.S. application Ser. No. 12/308,249 is a U.S. National Stage of PCT Application No. PCT/SE08/050036 filed on Jan. 14, 2008, which claims priority to Swedish Application No. 0700102-7 filed on Jan. 12, 2007, the entire contents of which are hereby incorporated by reference.

FIELD OF THE INVENTION

The present invention relates to semiconductor devices based on nitride semiconductor nanowires and the method of producing such by the growing. Nitride semiconductor nanowires can be used as diodes, light emitting diodes LEDs, laser diodes LDs and transistors, for example. In particular the invention relates to a method of fabricating upstanding GaN nanowires with a limited lateral growth.

BACKGROUND

To use nitride semiconductors in semiconductor devices, in particular optoelectronic devices, has received considerable attention for a relatively long time not at least due to the potential possibility to achieve components active in wavelength areas not accessible with conventional semiconductor materials. In the 1990's, two breakthroughs have been made on nitride semiconductor growth: the fabrication of high-quality GaN films and the realization of p-type GaN. Following these, blue and green LEDs and Laser diodes have been commercialized, and UV LED began to be reported based on AlN. Nitride based semiconductors are also of interest for transistors and other electronics in high voltage and high temperature applications.

The GaN films are typically grown by industrial scale MOCVD techniques. To achieve acceptable quality of the films the growth is performed with high precursor flow such as $NH_3$ and TMG (trimethylgallium), and hence high partial pressures. A commonly used measure is the so called "V/III-ratio" which relates the molar flow of the precursor elements, for example the molar ratio between the $NH_3$ and TMG. The V/III-ratio used for GaN film growth is in the range of 1000-10000.

Top standard GaN films of today do still have very high densities of defects, however. Under such background, 1-dimensional structures, that is nanowires based on nitrides have attracted plenty of attentions from researchers. Several methods such as VLS, template-confinement growth, and oxide-assisted growth have been reported for GaN nanowires growth.

Selective area growth of GaN has also been studied extensively from 1990's to reduce the dislocations density in GaN films. From dot-patterned GaN openings, Akasaka et al. showed GaN columns growth with the diameter of 5 μm [1]. Recently, Hersee et al. reported array fabrication of GaN wires sized by 221 nm using selective area growth. It is described that pulsed growth had to be used for growing GaN nanowires to confine the lateral growth [2]. Pulsed growth is also referred to as migration enhanced growth. The method may be described as a two step method comprising an initial nanowire growth step referred to as a selective growth step wherein both precursor gases are provided. The initial growth step is followed by a secondary step of pulsed growth, wherein precursor gases are provided one at the time.

SUMMARY OF THE INVENTION

The reported achievements indicate the great potential of the techniques but improvements are needed to provide methods that produce epitaxial vertical-standing GaN nanowires without crystal defects such as stacking faults and dislocations, and to provide methods that are well suited to scale up to industrial production.

The object of the present invention is to provide a method and a semiconductor device that overcomes the drawbacks of the prior art.

The nitride based semiconductor nanowire according to the invention has the same crystal structure throughout its entire length, i.e., the nanowires do not exhibit stacking fault close to the base. Preferably the crystal structure is hexagonal. Nanowires with the same crystal structure throughout their length can be produced with the below described method according to the invention.

A semiconductor device according to the invention comprises nitride semiconductor nanowires each with the same crystal structure throughout the entire length of the nanowire. A majority of the plurality of nanowires should have only one crystal structure. Even more preferably at least 90% of the nanowires of a semiconductor device each have the same crystal structure. Even more preferably 99% of the nanowires of a semiconductor device each have the same crystal structure. Semiconductor devices, for example a LED device with a plurality of nanowires are possible to produce with the method according to the invention.

The method of growing nitride based semiconductor nanowires, such as III-nitride semiconductor nanowires that are made of a compound semiconductor that includes one or more elements from Group III of the periodic chart and nitrogen, according to the invention utilizes a chemical vapor deposition CVD based selective area growth technique. A nitrogen source and a metal-organic source are present during the nanowire growth step and at least the nitrogen source flow rate is continuous during the nanowire growth step. The V/III-ratio utilized in the inventive method is significantly lower than the V/III-ratios commonly associated with the growth of nitride based semiconductor.

An embodiment of the method of the present invention comprises a planar growth phase that is subsequent to the nanowire growth phase described above. The planar growth phase utilizes a V/III-ratio that is significantly higher than the V/III-ratio of the nanowire growth phase. The planar growth phase results in a primarily lateral growth of the previously grown nanowire, so that the nanowire is at least partly enclosed by a new layer. The planar growth can be repeated with different material compositions, doping, etc, giving a shell-like structure. According to one embodiment the nanowire in combination with one or more of the shell layers forms the pn-junction of a LED. Also other active semiconductor electronic and optoelectronic devices such as transistors can be fabricated in the same manner.

One advantage afforded by the method of the invention is that nitride semiconductor nanowires without crystal defects, such as dislocations and stacking faults can be grown. Hence, nitride semiconductor devices comprising a large plurality of nanowires, with a very low fraction of defect nanowires may be fabricated.

Another advantage of the method according to the invention is that the total growth rate of nanowires is considerably higher than prior art methods of growing nitride nanowires. Growth rates of 200 nm/min have been demonstrated.

The method according to the invention, utilizing a low V/III-ratio and low sources flows has a lower material consumption than comparable prior art methods. In addition the continuous V/III-ratio makes the growing conditions easier two optimize than pulsed growth methods.

The method according to the invention is advantageous also for structures comprising more than two elements, for example ternary compositions such as InGaN. Using InGaN in the nanowire would be advantageous due to reduced strain with regards to shell layers. However, InGaN is a thermally unstable material and a $NH_3$ flow is needed is to prevent the dissociation of In—N bonds. Hence, the prior art methods utilizing disrupted $NH_3$ flows may not be suitable for producing InGaN nanowires. In the method of the invention, utilizing a continuous nitrogen source flow, for example $NH_3$, these effects are eliminated or at least reduced.

The method according to the invention is based on MOCVD techniques. MOCVD are used in the industry, and the method is well suited for industrial scale production.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein:

FIG. 5 *a-b* illustrate schematically embodiments of a nanostructured LED device according to the invention;

FIG. 6 illustrates schematically a nanowire growth apparatus according to the invention.

FIG. 7 *a-b* are SEM-images illustrating the result of growth conditions not giving nanowires;

FIG. 9 *a-b* are SEM-images illustrating the result of growth conditions giving nanowires;

FIG. 11 *a-c* are SEM-images illustrating the effects of source doping.

DETAILED DESCRIPTION

The semiconductor device and method to produce such according to the present invention comprises at least one nitride semiconductor nanowire, for example a GaN nanowire.

Figure 1:
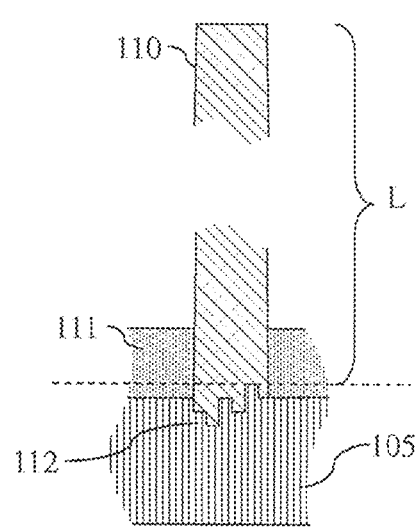
FIG. 1 illustrates schematically a nanowire according to the invention.

A nitride semiconductor nanowire 110, which is schematically illustrated in FIG. 1, is in this context defined as an essentially rod-shaped structure with a diameter less than 1 micron, such as 500 nm and a length up to several μn. The nanowire 110 is at its base epitaxially connected to a substrate 105, which may comprise of epitaxial layers, for example a layer of GaN closest to the nanowire 110. The nanowire 110 protrudes through an opening 113 in a growth mask 111 of for example $SiN_x$ or another insulating layer. As indicated in FIG. 1 the surface of the substrate 105 may exhibit some roughness 112, exaggerated in the figure, for illustrative purposes only. Hereinafter the term nanowire should be understood as referring to the structure not restricted by the surface roughness, i.e., the nanowire begins in the first atomic layer above the substrate 105, or alternatively worded in the first "free" layer. This first layer will however typically be within the opening of the growth mask 111. The length of the nanowire is denoted L.

Nitride nanowires produced with prior art techniques typically comprises a large number of defects. The above referred pulsed selective growth represents a significant improvement, but the method may produce stacking faults close to the base of the nanowire. Typically a nanowire produced with such method will have a variation from a cubic to a hexagonal crystal structure close to the base. A semiconductor device comprising a plurality of such nanowires will have a substantial portion of, or all, nanowires exhibiting this type of defects. Stacking faults have effects on the physical properties of the nanowire as regard to optical and electrical properties. In for example a LED application also the relatively small distortion introduced by a stacking fault close to the base may impede the performance since the stacking fault increase the electrical resistance. Since the area is very small, the increased resistance may have significant influence on the performance of the LED.

The nitride semiconductor nanowire according to the invention has the same crystal structure throughout its entire length, i.e., the nanowires do not exhibit stacking fault close to the base. Preferably the crystal structure is hexagonal. Nanowires with the same crystal structure throughout their length can be produced with the below described method according to the invention.

The semiconductor device according to the invention comprises nanowires 105 each with the same crystal structure throughout the entire length of the nanowire. A majority of the plurality of nanowires should have only one crystal structure. Even more preferably at least 90% of the nanowires of a semiconductor device each have the same crystal structure. Even more preferably 99% of the nanowires of a semiconductor device each have the same crystal structure. Semiconductor devices, for example a LED device with a plurality of nanowires are possible to produce with the method according to the invention.

The method of growing nitride semiconductor nanowires according to the invention utilises a CVD based selective area growth technique. A nitrogen source and a metalorganic source are present during the nanowire growth step and at least the nitrogen source flow rate is continuous during the nanowire growth step. The V/III-ratio utilized in the inventive method is significantly lower than the V/III-ratios commonly associated with the growth of nitride based semiconductor.

The method can be implemented by metal organic chemical vapor deposition (MOCVD) processes and apparatuses therefore. The method can also be implemented by other CVD and hydride vapor phase epitaxy (HVPE) based processes with modifications that should be obvious for the skilled person. The method is illustrated schematically in FIG. 2a and by the flowchart of FIG. 2b, and comprises the steps of:

a) Providing a growth mask 111 on a substrate 105. The substrate 105 is for example GaN and the growth mask 111 a dielectric such as of $SiN_x$ or $SiO_x$.

b) Produce openings 113 in the growth mask. The openings are preferably well controlled, both in regards to their diameter and their relative positioning. Several techniques known in the art can be used for the procedure including, but not limited to electron beam lithography (EBL), nanoimprint lithography, optical lithography and reactive ion etching (RIE) or wet chemical etching methods. Preferably the openings are approx 100 nm in diameter and pitched 0.5-5 μm apart. The openings define the position and the diameter of the nanowires 105 to be produced.

c) Nanowire growth by a CVD based process wherein the precursor source flows are continuous. The precursor source flow rates are adjusted to achieve a low supersaturation in the growth zone. The V/III-ratio should be in the range 1-100, preferably in the range 1-50, and even more preferably in the range 5-50. It should be noted that this V/III-ratio is considerably lower than the ratios used for film growth.

Figure 3A:
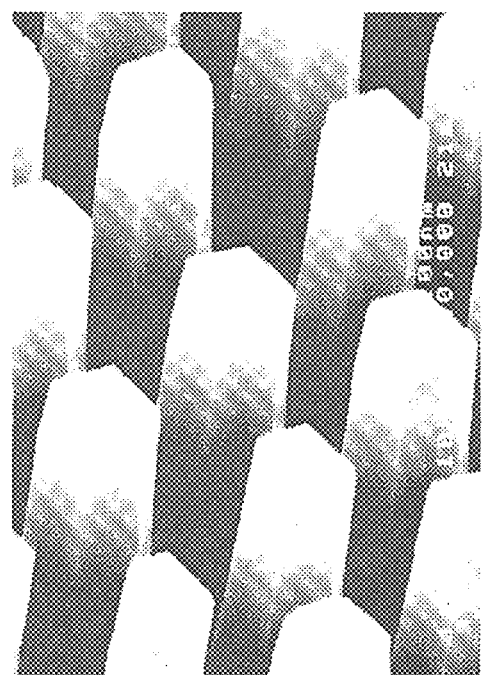
FIG. 3 *a-b* are SEM images of nanowire structures according to the invention.
Figure 3B:
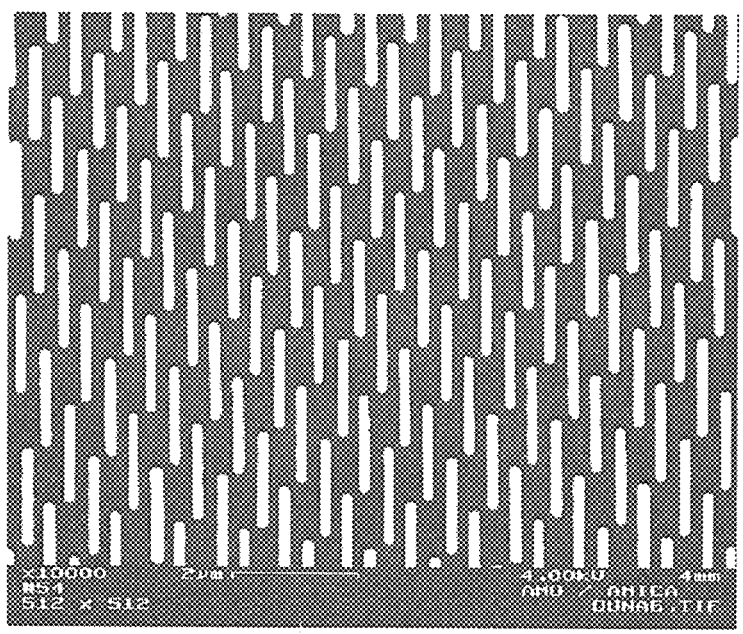

Nanowires fabricated with the method according to the invention are illustrated in the SEM images of FIGS. 3a-b. On the starting substrate layer of $SiN_x$ (30 nm in thickness) was deposited by PECVD. In a subsequent step, arrays of dot-patterned GaN openings (around 100 nm in diameter) were made by electron beam lithography, EBL, and reactive ion etching, RIE. The pitch between the openings was ranged as 0.5-3.2 μm, giving a growth mask that defines both the diameters and the positions of the nanowires. Then, the as-processed samples were inserted into a horizontal MOCVD chamber to grow GaN nanowires. FIG. 3a illustrates further that nanowires with a pyramidal ending can be formed, which is advantageous for certain applications.

The method may comprises various steps for enhancing the growth conditions, illustrated as a pretreatment step c'), for example an annealing prior to the nanowire growth step c). The pretreatment step may comprise a plurality of substeps. It should be noted that the pretreatment step according to the invention does not result in nanowire growth, although one or more of the precursors could be used for the pretreatment, for example annealing. Also a variation of the V/III ratio during the nanowire growth step c) can be envisaged. However, the flow of the precursor materials should not be disrupted during the nanowire growth step.

The nanowires according to the invention can be used in many different applications. Applications of particular interest include electronic, optical and optoelectronic devices including, but not limited to: diodes, light emitting diodes (LEDs), transistors, photonic crystals and detectors. The nanowires can also be used as structural building blocks used to, for example, form coalesce continuous layers of GaN, which can have a very low defect density. How coalesce layers are formed from nanowires are described in the application U.S. Ser. No. 10/613,071.

An application of high commercial value is LED devices, which will be used as a non limiting example. As appreciated by the person skilled in the art transistors and other electronic devices can be fabricated in the same manner.

Figure 4A:
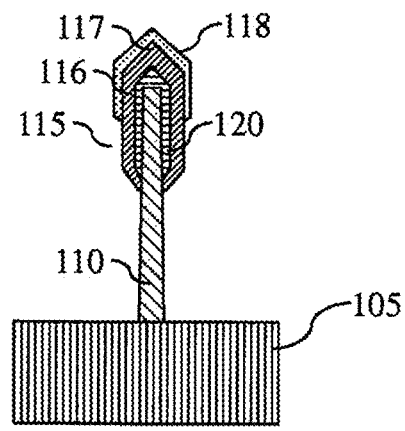
FIG. 4 *a-b* illustrate schematically embodiments of a nanostructured LED comprised in a nanostructured LED device according to the invention.
Figure 4B:
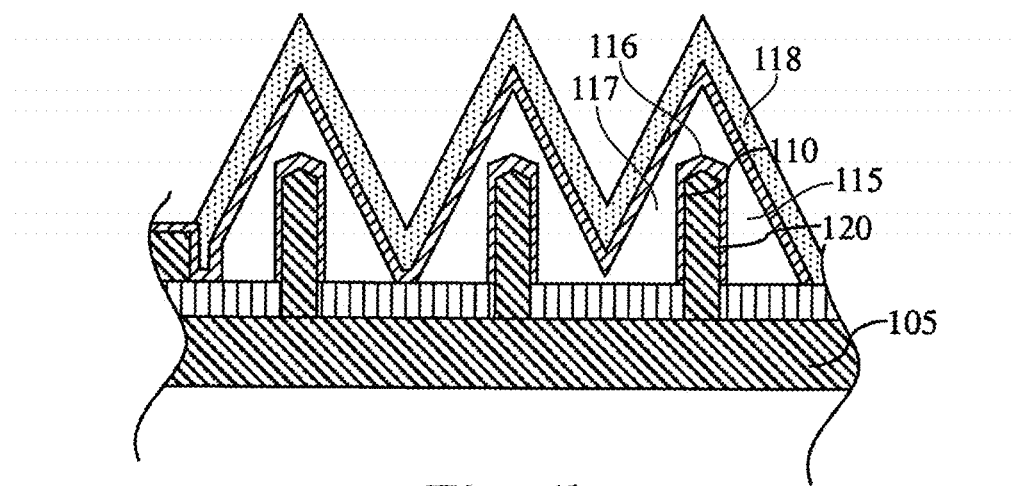

LED devices comprising a semiconductor nanowire according to the invention are schematically illustrated in FIGS. 4a-b, and comprise a substrate 105, wherein the nanowire 110 has been epitaxially grown from the substrate 105. A portion of the nanowire 110 is enclosed by a volume element 115. The volume element 115 is preferably epitaxially connected to the nanowire 110. A pn-junction necessary for the diode functionality is formed in the volume element 115 or alternatively in the nanowire 110. A top contact is provided on the volume element 115, for example on top, or in a wrapping configuration on the circumferential outer surface. The nanostructured LED 100 may be contacted in the other end for example via the substrate, forming a common bottom contact, through a dedicated contacting layer close to the substrate, or by a wrap contact at the lower end of the nanowire 110. The nanowire 110 typically has a diameter in the order of 50 nm to 500 nm, and the volume element a diameter in the order of 500 nm to 10 μm. The volume element 115, or bulb, may have different shape and the volume element and nanowire in combination designed to give different position and shape of the active region giving the recombination conditions required for the light production. The volume element 115 may further provide a high degree of doping and the charge carriers are injected into the nanowire.

FIG. 4a illustrates a design wherein the volume element 115 comprises a plurality of layers 116, 117 in a shell-like structure. The volume element 115 may also be partly enclosed by a contacting layer 118. A doping layer 117 provides the p or n region and the well layer 116 comprises the active region 120 under operation. Alternatively the well can be made out of a plurality of sub-layers. The structure may comprise other layers (not shown) for enhancing doping properties, improve contacting, etc. These structures are also referred to as core-shell structures.

Another design is illustrated in FIG. 4b, wherein the nanowire 110 is enclosed by a pyramidal overgrowth forming the volume element 115. Similar to above the pyramidal overgrowth may comprise a plurality of layers 116, 117, 118 providing the doping and quantum wells necessary for the LED functionality resulting in an active region 120.

According to one embodiment of the method of the invention further growth steps are included that provides the overgrowth, or volume element on the nanowire. The method, as described with references to the flowchart of FIG. 2b, comprises two phases. The first phase that can be considered as a nanowire growth phase, comprising the steps a-c) wherein nanowire growth conditions, i.e., the low V/III-ratio, is provided. In the second phase the nanowires are overgrown by the volume element 115, which typically comprises a plurality of different layers, in a CVD-based process similar to the growth process in the first phase and preferably in a same growth chamber, but with growth parameters adjusted for planar growth, i.e., with a V/III-ratio that is higher than in the nanowire growth, typically in the order of 1000. The method according to the embodiment may be seen as a nanowire growth phase followed by a planar growth phase, or lateral growth phase. The nanowire growth phase producing nanowires with surfaces that are near ideal for planar growth, since the side walls of the nanowires will be non-polar, so called m-planes, {1-100}. Such surfaces are extremely hard to produce by conventional methods. In the planar growth phase, or lateral growth phase, following the nanowire growth phase, the ideal surfaces are utilized for the growth of the shell layers in steps d), e), f) . . . , forming parts of the LED device. As appreciated by the person skilled in the art other devices such as diodes and transistors may be fabricated in the same manner.

The method according to the invention is applicable also for structures comprising more than two elements, for example ternary compositions such as InGaN. Strain is a serious problem for making high In content InGaN/GaN core shell structures as illustrated in FIG. 5a, wherein a GaN nanowire 510 is enclosed by the shell InGaN layer 516. Using InGaN also in the nanowire 511 would reduce the strain in the shell InGaN layer, as illustrated in FIG. 5b. However, InGaN is a thermally unstable material and a $NH_3$ flow is needed is to prevent the dissociation of In—N bonds. Hence, the prior art methods utilizing disrupted NH3 flows may not be suitable for producing InGaN nanowires. In the $NH_3$ interruption step at InGaN growth temperatures it implies that In—N bonds dissociate and In can desorb from the crystal. Employing continuous nanowire growth as afforded by the present invention supports growth of higher In content InGaN nanowires.

A conventional MOCVD, or MOVPE, apparatus may not be optimal for carrying out the method according to the embodiment comprising a nanowire growth phase and an immediate subsequent planar growth phase. Due to technical limitations in the gas supply systems, the same gas supply systems may not be able to provide both the low V/III-ratio and the high V/III-ratio associated with the nanowire growth phase and the planar growth phase, respectively, with required accuracy. A growth apparatus according to the invention, schematically illustrated in FIG. 6 comprises a growth chamber 610, wherein the sample 615 is placed. A III-supply system 622 comprises a III-source 620 and a mass flow controller (MFC). The V-supply system comprises a V-source 630 connected to a low source flow rate V-supply line 634 comprising a low flow rate MFC 633, and separate high source flow rate V-supply line 632 comprising a high flow rate MFC 631. The low flow rate MFC 633 is adapted to handle the low flow rates of for example $NH_3$ associated with the nanowire growth phase, and the high flow rate MFC 631 is adapted to handle the high flow rates associated with the planar growth phase. By switching between the two separate V-supply lines then going from the nanowire growth phase to the planar growth phase a rapid change can be made with the required accuracy of the flow rates in the two different phases. The apparatus may of course be provided with more separate supply lines if the required flow rates are not possible to obtain with two MFCs.

The applicability of the method of the invention is demonstrated by the examples below, which should be regarded as non-limiting examples.

Figure 2A:
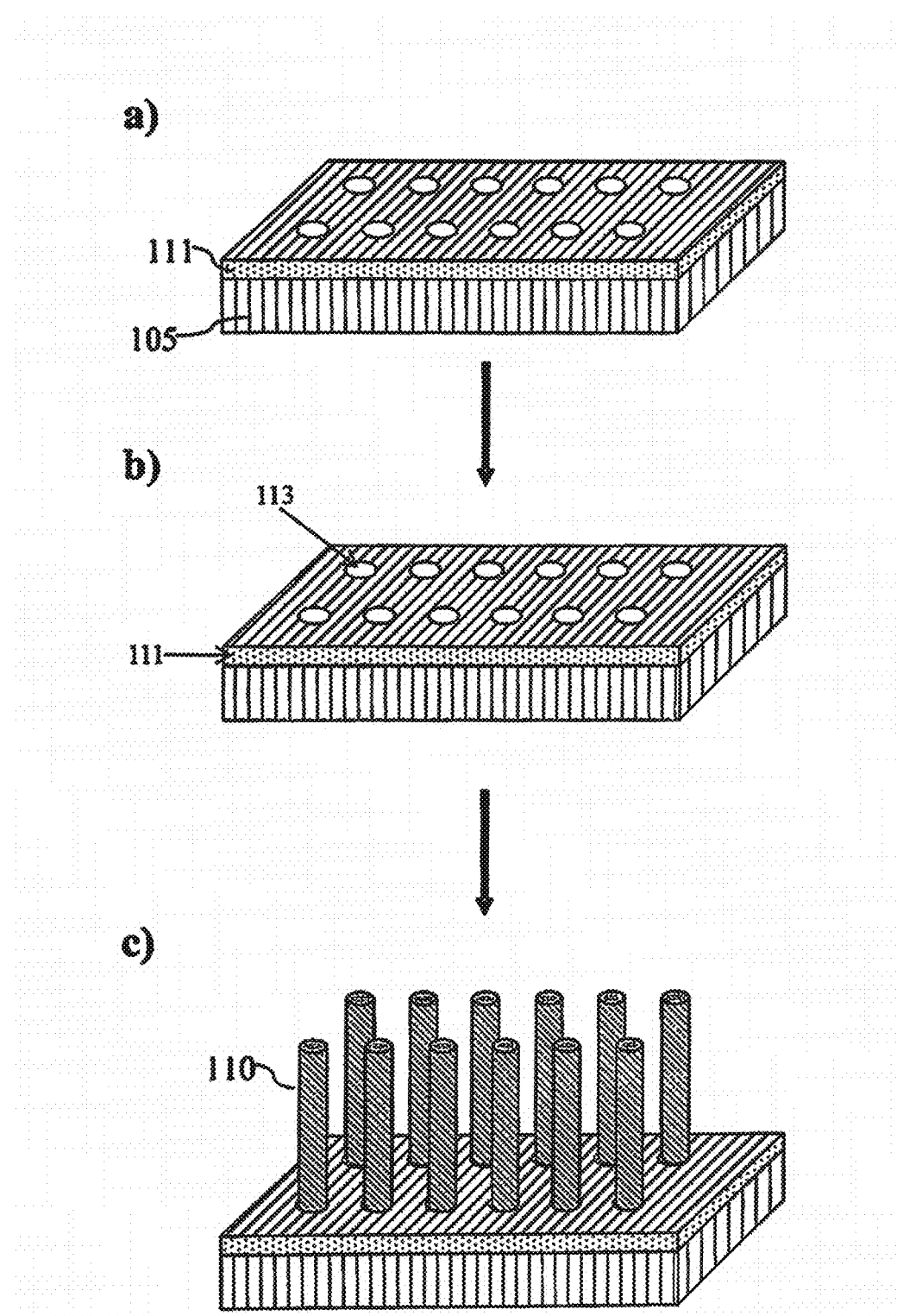
FIG. 2 *a* illustrates schematically the method according to the invention and 2*b* is a flowchart over the method according to the invention.
Figure 2B:
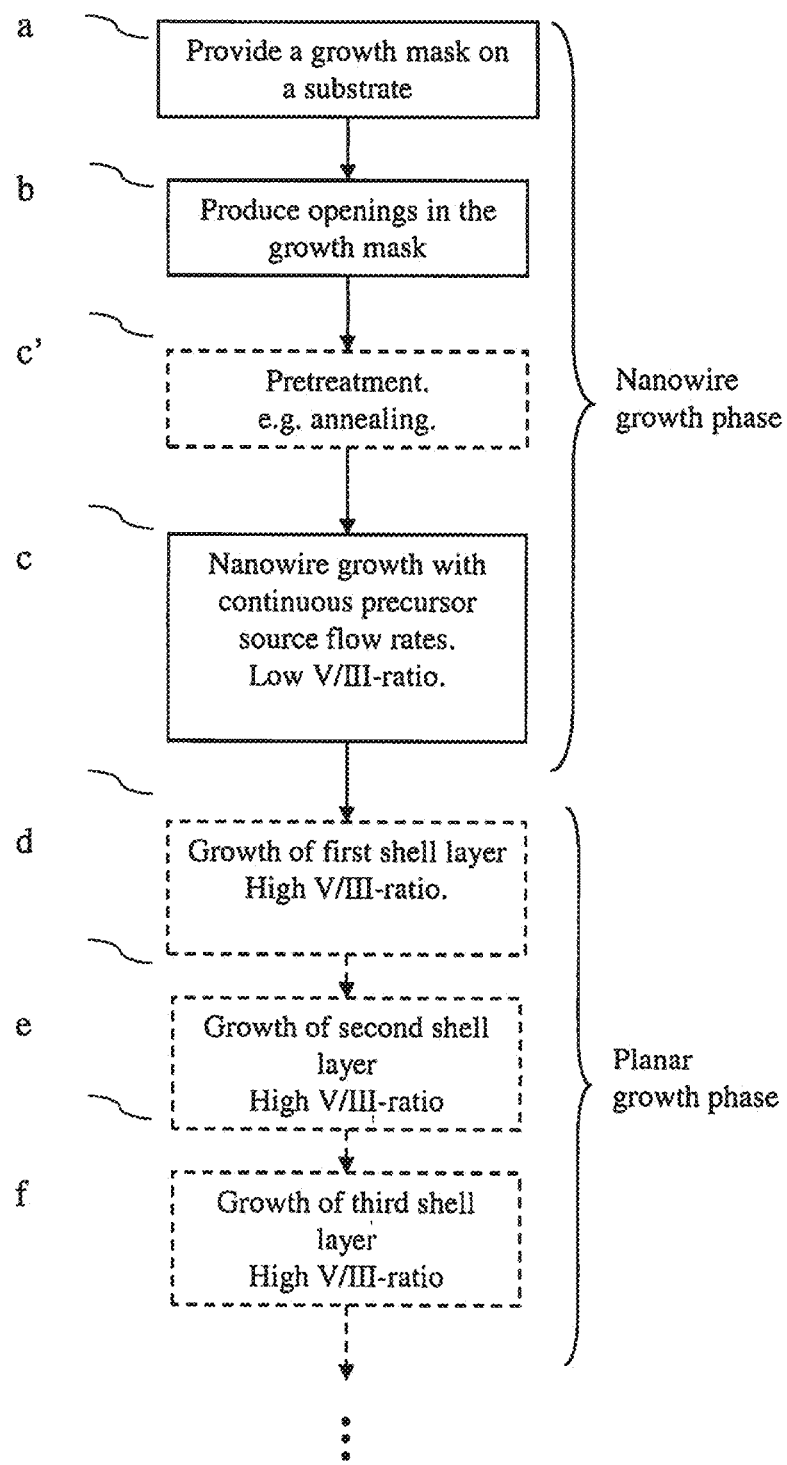

FIGS. 2a-2b may illustrate the fabrication sequences of GaN nanowires by selective area growth. GaN epitaxial films on sapphire, SiC or Si and even self supporting GaN are used as the starting substrates, on which a layer of SiN x (30 nm in thickness) was deposited by PECVD (a). Following this, arrays of dot-patterned GaN openings (around 100 nm in diameter) were made by EBL and RIE (b). The pitch between the openings was ranged as 0.5~3.2 μm. Then, the as-processed samples were inserted into a home-made, horizontal MOCVD chamber to grow GaN nanowires (c). The growth process comprises an initial phase wherein, temperature was ramped up to the growth zone of 900-1200° C. within 5 min with a high NH3 flow rate of 75 standard cubic centimeters per minute sccm. The substrate is annealed for 1 min at growth temperature. In a subsequent nanowire growth phase the NH3 flow rate was reduced to 3.0~0.2 sccm to start the growth with introducing TMG (trimethylgallium) into the chamber. Low TMG flow rate was used through this work, between 0.12 and 1.2 μmol/min.

Figure 8A:
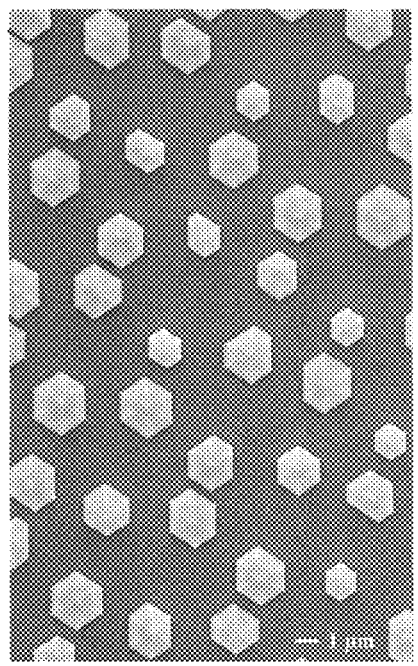
FIG. 8 *a-b* are SEM-images illustrating the result of growth conditions wherein nanowires are starting to form.
Figure 8B:
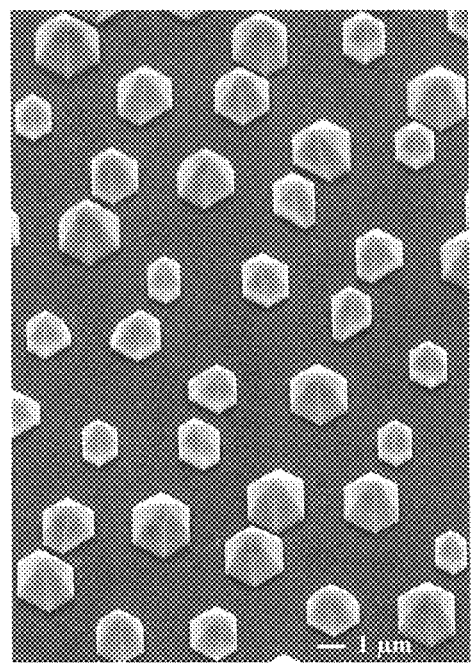

According to the invention, verified in experiments, the $NH_3$ flow rate is the crucial factor controlling the growth forms from the openings. FIGS. 7a-7b show the SEM images of the sample grown with the $NH_3$ flow rate of 3.0 sccm. From the top-view image FIG. 7a, it can be seen that the selective growth from the openings, which is the same as what was reported. The point needed to be specified here is that the lateral size after growth is larger than 1.0 μm which is much larger than the openings size of around 100 nm. Thus, the lateral growth after GaN had grown out of openings is substantial. FIG. 7b shows the SEM image taken by tilting the sample by 35°, which clearly presents that what were obtained are pyramids, not wires. The pyramids are delimited by six equivalent (1101) planes. The dangling bonds density of (1101) plane is $16.0/nm^2$, which is higher than that of (1100) plane ($12.1/nm^2$) and (0001) plane ($11.4/nm^2$) [3]. From this point of view, the planes of (1100) and (0001) are expected to appear after GaN grows out of the openings. But, FIG. 2 shows the opposite. So, a possible explanation is that (1101) plane has the N-polarization, which makes it stable when $NH_3$ flow rate is high. Based on this, the flow rate of 3 sccm for $NH_3$ is actually still high for growing GaN wires faceted by (1100) plane. FIGS. 8a-8b show the SEM characterizations of the sample grown under $NH_3$ flow rate of 1.0 sccm. The top-view image FIG. 8a is similar as FIG. 7a. But, the 35° tilted image, FIG. 8b is different, that is vertical facets of (1100) plane begin to appear underneath the pyramids caps.

This is promising and indicates that N-polarized (1101) planes begin to be incapable of delimiting the growth forms of pyramids. Despite this, the lateral size is still much larger than the one of openings, which is the same as shown FIG. 7.

Figure 10A:
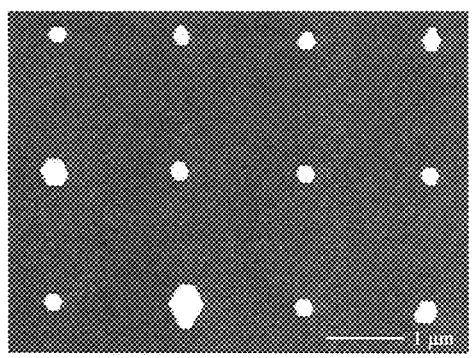
FIG. 10 *a-c* are SEM-images illustrating the result of growth conditions giving nanowires.
Figure 10B:
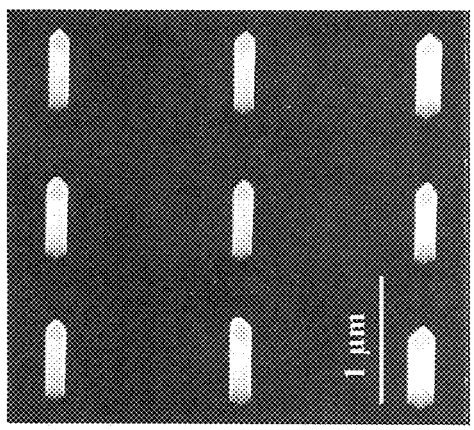
Figure 10C:
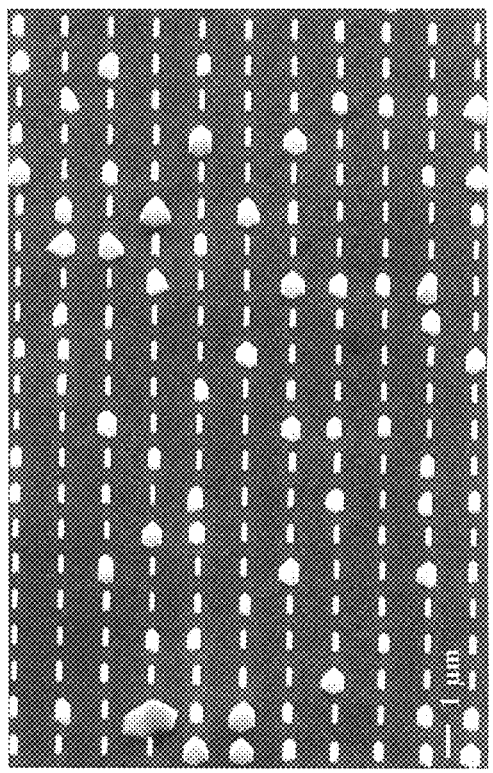

FIGS. 9a-9b show the growth results with reducing $NH_3$ flow rate further to 0.5 sccm. Both top-view (a) and 35° tilted (b) images indicate the size shrinking in lateral direction, although they are still larger than the openings size of around 100 nm. The tilted image FIG. 9b also shows the vertical facets. As $NH_3$ flow rate was lowered to 0.2 sccm, true GaN nanowires began to be synthesized as shown in FIGS. 10a-10c, wherein (a) is a top-view; (b) and (c) are 45° tilted. Although there are some crystallites larger than 100 nm, but most of the openings evolve into wires which have the diameter in 100 nm, same as the openings size. So, the lateral growth is also in a good control when $NH_3$ flow rate is 0.2 sccm. As for the vapor-phase growth, the degree of supersaturation determines the prevailing growth morphology, that is: a low supersaturation is required for nanowire growth whereas a medium supersaturation supports bulk crystal growth. At high supersaturation, powders are formed by the nucleation in vapor phase [4-5]. According to this, it's reasonable to say that reducing $NH_3$ flow rate to 0.2 sccm lowers the supersaturation effectively which confines the lateral growth and makes the growth happen only in the axial direction. Here, all of the growth has been conducted with keeping TMG and $NH_3$ flowing into the chamber simultaneously and continuously during the whole growth process. However, work reported in prior art seems to indicate that pulsed growth mode was necessary to get nanowire growth. Based on the result presented here it is clear that nanowire growth can be achieved with continuous source flow rate. In order to fabricate the GaN nanowires the $NH_3$ flow rate should be adjusted so that a low supersaturation is achieved, or alternatively described; to achieve migration enhanced growth.

$Cp_2Mg$ has been shown to enhance vertical side wall facet formation [6]. In FIGS. 11a-c, relating to table 1, it is illustrated that doping sources, as $Cp_2Mg$, potentially, can stabilize the nanowire growth conditions by this effect. Also, it is further shown that by increasing supersaturation/NH$_3$ flow rate pyramidal growth can be re-established. This can be utilized to in a lateral growth phase provide lateral growth of the nanowires.

TABLE 1

| Growth nr | NH$_3$-flow [sccm] | Cp$_2$Mg-flow [sccm] | Comments |
|---|---|---|---|
| a | 1 | — | No doping |
| b | 1 | 70 | Perfect wires |
| c | 10 | 70 | Increasing NH$_3$-flow to re-establish pyramidal growth |

Nanowires fabricated by the method of the invention can be utilized in a wide range of device, for example diodes, LEDs, transistors, especially field effect transistors etc. Nitride based electronics are of special interest in high voltage and high temperature applications.

In conclusion, through decreasing NH$_3$ flow rate, GaN nanowires can be fabricated by MOCVD using selective area growth from the GaN openings. The key point to grow GaN nanowires is to control the supersaturation. Previously this has only been achieved by using pulsed growth technique [2]. In the results presented it is shown that pulsed growth is not a necessary method but that reducing NH$_3$ flow rate sufficiently can also produce nanowires. The work of growing nitrides heterostructures in both axial and radial directions with this method is following.

The method of the invention has been described with GaN, NH$_3$ and TMG as non limiting examples. The skilled person appreciate that the principles of the method is applicable to the growth of other semiconductor nitride based nanowires, for example comprising Indium or Aluminum such as AlInGaN. III-NAs, and III-NP. NH$_3$ is a convenient and well established nitrogen source, but other sources are known and could be utilized, for example tert-butylamine N(C$_4$H$_9$)H$_2$, 1,1-Dimethylhydrazine (CH$_3$)$_2$NNH$_2$, and tert-butyl hydrazine (CH$_3$)$_3$CNHNH$_2$. Depending of choice of the III-V semiconductor different sources are available. Different sources will lead to different appropriate values of the flow rates in order to achieve the low supersaturation, and hence the V/III-ratio will need to be adjusted accordingly. Such adjustments can be made by the skilled person given the above teaching.

REFERENCES

[1] T. Akasaka, Y. Kobayashi, S. Ando, and N. Kobayashi, Appl. Phys. Lett. 71 (1997) 2196.

[2] S. D. Hersee, X. Sun, and X. Wang, Nano Lett. 6 (2006) 1808.

[3] K. Hiramatsu, K. Nishiyama, A. Motogaito, H. Miyake, Y. Iyecchika, and T. Maeda, Phys. Stat. Sol. (a) 176 (1999) 535.

[4] G. W. Sears, Acta Metallurgica, 3 (1955) 367.

[5] Y. Xia, P. Yang, Y. Sun, Y. Wu, B. Mayers, B. Gates, Y. Yin, F. Kim and H. Yan, Adv. Mater. 15 (2003) 353.

[6] B. Beaumont, S. Haffouz, and P. Gibart, Appl. Phys. Letters 72 (1997) 922.

The invention claimed is:

1. A method of forming a light emitting diode (LED), comprising:
    growing III-nitride based semiconductor nanowires by chemical vapor deposition (CVD) in a nanowire growth step, wherein a nitrogen source flow and a metal-organic source flow are present; and
    forming at least one III-nitride pyramidal shell layer on the III-nitride based semiconductor nanowires by CVD in a shell growth step, wherein an entirety of outer sidewalls of the at least one III-nitride pyramidal shell layer is delimited by six (1101) planes, wherein the nitrogen source flow and the metal-organic source flow are present, wherein:
    a molar V/III-ratio comprises a ratio of the nitrogen source flow rate and the metal-organic source flow rate;
    the molar V/III-ratio during the shell growth step is higher than the molar VIII-ratio during the nanowire growth step; and
    the at least one III-nitride pyramidal shell layer is located in an active region of the LED.

2. The method of claim 1, further comprising forming a III-nitride pyramidal layer over the at least one III-nitride pyramidal shell layer.

3. The method of claim 1, wherein the III-nitride based semiconductor nanowires are grown from a substrate through openings in a growth mask layer located over the substrate.

4. The method of claim 1, wherein the nitrogen source flow and the metal-organic source flow are continuous during the nanowire growth step.

5. The method of claim 1, wherein growing III-nitride based semiconductor nanowires by CVD in a nanowire growth step comprises growing GaN nanowires at a temperature of 900 to 1200° C.

\* \* \* \* \*